(12) United States Patent
Orlowski et al.

(10) Patent No.: US 10,043,707 B2
(45) Date of Patent: Aug. 7, 2018

(54) ADDITIVE CONDUCTOR REDISTRIBUTION LAYER (ACRL)

(71) Applicant: RF Micro Devices, Inc., Greensboro, NC (US)

(72) Inventors: John August Orlowski, Summerfield, NC (US); David Jandzinski, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 373 days.

(21) Appl. No.: 13/850,588

(22) Filed: Mar. 26, 2013

(65) Prior Publication Data

US 2014/0106564 A1    Apr. 17, 2014

Related U.S. Application Data

(60) Provisional application No. 61/714,326, filed on Oct. 16, 2012, provisional application No. 61/790,080, filed on Mar. 15, 2013.

(51) Int. Cl.
*H01L 21/44* (2006.01)
*H01L 21/768* (2006.01)
(Continued)

(52) U.S. Cl.
CPC .... *H01L 21/76838* (2013.01); *H01L 21/4832* (2013.01); *H01L 23/49582* (2013.01);
(Continued)

(58) Field of Classification Search
USPC ......................................... 438/674
See application file for complete search history.

(56) References Cited

U.S. PATENT DOCUMENTS 6,670,271 B1* 12/2003 Subramanian ........ H01L 21/288
257/E21.174
7,202,007 B2* 4/2007 Shibata ............... C23C 14/0005
156/232
(Continued)

OTHER PUBLICATIONS

Fan, Xuejun, "Wafer Level Packaging (WLP): Fan-in, Fan-out and Three-Dimensional Integration," 2010 11th International Conference on Thermal, Mechanical & Multiphysics Simulation and Experiments in Micro-Electronics and Micro-Systems (EuroSimE), Apr. 26-28, 2010, 7 pages.
(Continued)

*Primary Examiner* — Joseph C Nicely
*Assistant Examiner* — Wilner Jean Baptiste
(74) *Attorney, Agent, or Firm* — Withrow & Terranova, P.L.L.C.

(57) ABSTRACT

A first plate-able layer is selectively plated to form one or more redistribution paths. The connection points of an IC package are connected to the redistribution paths, and the IC package is over molded for stability. The first plate-able layer is then removed, leaving the one or more redistribution paths exposed. The redistribution paths allow one or more contact points of the IC package to be moved to a new location in order to facilitate integration of the IC package into a system. By plating the redistribution paths up from the first plate-able layer, fine geometries for repositioning the contact points of the IC package with minimal conductor thickness are achieved without the need for specialized manufacturing equipment. Accordingly, a redistribution layer is formed at a low cost while minimizing the impact of the layer on the operation of the IC device.

22 Claims, 15 Drawing Sheets

(51) Int. Cl.
   *H01L 23/495* (2006.01)
   *H01L 21/48* (2006.01)
(52) U.S. Cl.
   CPC .............. *H01L 2224/13* (2013.01);
      *H01L 2224/48091* (2013.01); *H01L 2224/73265* (2013.01)

(56) References Cited

U.S. PATENT DOCUMENTS

| | | | |
|---|---|---|---|
| 8,034,921 B2* | 10/2011 | Manoharan | C07D 211/24 536/24.5 |
| 2001/0014538 A1* | 8/2001 | Kwan | H01L 21/4832 438/690 |
| 2002/0190377 A1* | 12/2002 | Igarashi et al. | 257/738 |
| 2005/0112866 A1* | 5/2005 | Takewaki | H01L 21/76838 438/622 |
| 2006/0108693 A1* | 5/2006 | Cheng | B23K 35/0244 257/772 |
| 2007/0269590 A1* | 11/2007 | Miyamoto | H01L 21/4832 427/125 |
| 2008/0163787 A1* | 7/2008 | Abys et al. | 106/14.42 |
| 2008/0259523 A1* | 10/2008 | Lim | H01G 2/06 361/311 |
| 2010/0052146 A1* | 3/2010 | Jiang et al. | 257/690 |
| 2011/0156252 A1* | 6/2011 | Lin | H01L 21/568 257/738 |
| 2012/0320549 A1* | 12/2012 | Gottwald | H01L 21/4846 361/760 |

OTHER PUBLICATIONS

Kurita, Yoichiro et al., "Fan-Out Wafer-Level Packaging with Highly Flexible Design Capabilities," 2010 3rd Electronic System-Integration Technology Conference (ESTC), Sep. 13-16, 2010, 6 pages.

* cited by examiner

ADDITIVE CONDUCTOR REDISTRIBUTION LAYER (ACRL)

RELATED APPLICATIONS

This application claims the benefit of provisional patent application Ser. No. 61/714,326, filed Oct. 16, 2012, and provisional patent application Ser. No. 61/790,080, filed Mar. 15, 2013, the disclosures of which are hereby incorporated by reference in their entirety.

FIELD OF THE DISCLOSURE

The present disclosure relates generally to the miniaturization of integrated circuit (IC) packages, and specifically to the redistribution of the connection points of an IC package.

BACKGROUND

Modern integrated circuit (IC) packages are constantly shrinking in size to accommodate their increasing use in handheld devices. Although the use of small IC packaging saves space in a host device, the connection points of a small IC package may require significant resources to properly connect to a substrate for integration into a system. Further, the same components used in handheld devices may also be used in larger systems and devices where space is not an issue. Using a small IC package in a larger system may result in unnecessary complexity and expense due to the difficulty of integration.

Processes have been developed for producing redistribution layers for repositioning the connection points of an IC package. These redistribution layers may bring the connection points of the IC package closer together (i.e., a "fan in" layer), or further apart (i.e., a "fan out" layer). Processes for developing redistribution layers often require specialized equipment, thereby driving up the cost of a system. Further, the produced redistribution layers may introduce undesirable parasitic capacitance or inductance into a system due to the thickness of the conductive material in the layer. Accordingly, a process is needed to produce a redistribution layer for the connection points of an IC package at a low cost while minimizing the impact of the layer on the operation of the IC device.

SUMMARY

The present invention relates to a process for generating a redistribution layer for redistributing the contact points of an IC package. A carrier layer including a first plate-able layer is used to support one or more selectively plated redistribution paths. The first plate-able layer is selectively plated to form one or more redistribution paths. The connection points of an IC package are connected to the redistribution paths, and the IC package is over-molded for stability. The carrier layer is then removed, leaving the one or more redistribution paths exposed. The redistribution paths allow one or more contact points of the IC package to be moved to a new location in order to facilitate integration of the IC package into a system. By plating the redistribution paths up from the carrier layer, fine geometries for redistributing the contact points of the IC package with minimal conductor thickness are achieved without the need for specialized manufacturing equipment. Accordingly, a redistribution layer is formed at a low cost while minimizing the impact of the layer on the operation of the IC device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

DETAILED DESCRIPTION

Figure 1:
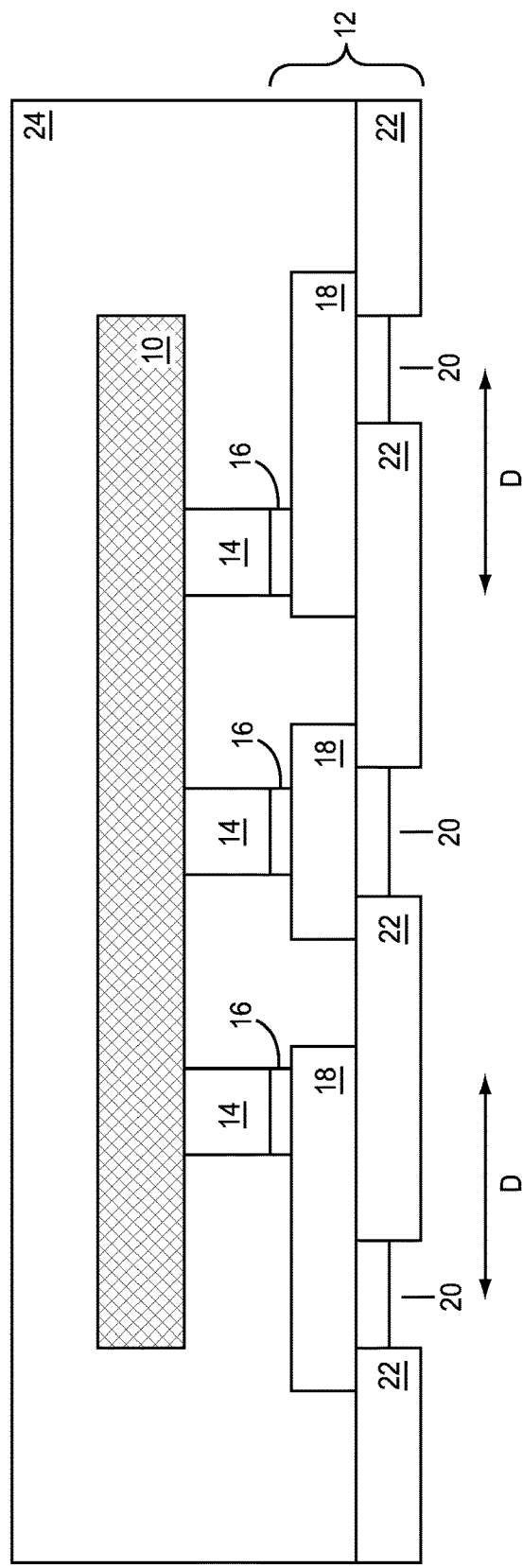
FIG. 1 is a schematic representation of an IC package with an attached redistribution layer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Turning now to FIG. 1, an IC package 10 with an attached redistribution layer 12 is shown. Connection points 14 of the IC package 10 are attached to the redistribution layer 12 at one or more package connection pads 16. Although the IC package 10 shown is a bumped die package, any form of IC package may be used according to the present disclosure. The package connection pads 16 are soldered to one or more redistribution paths 18, which are in turn plated to one or more redistributed connection pads 20. The redistribution paths 18 are covered by a patterned soldering mask 22. The IC package 10 and the redistribution layer 12 are stabilized by an over molding layer 24. As shown in FIG. 1, the redistributed connection pads 20 of the redistribution layer 12 relocate the connection points 14 of the IC package 10 by a predetermined distance D. Accordingly, the connection points 14 of the IC package 10 are redistributed to facilitate integration of the IC package 10 into a system.

Figure 2:
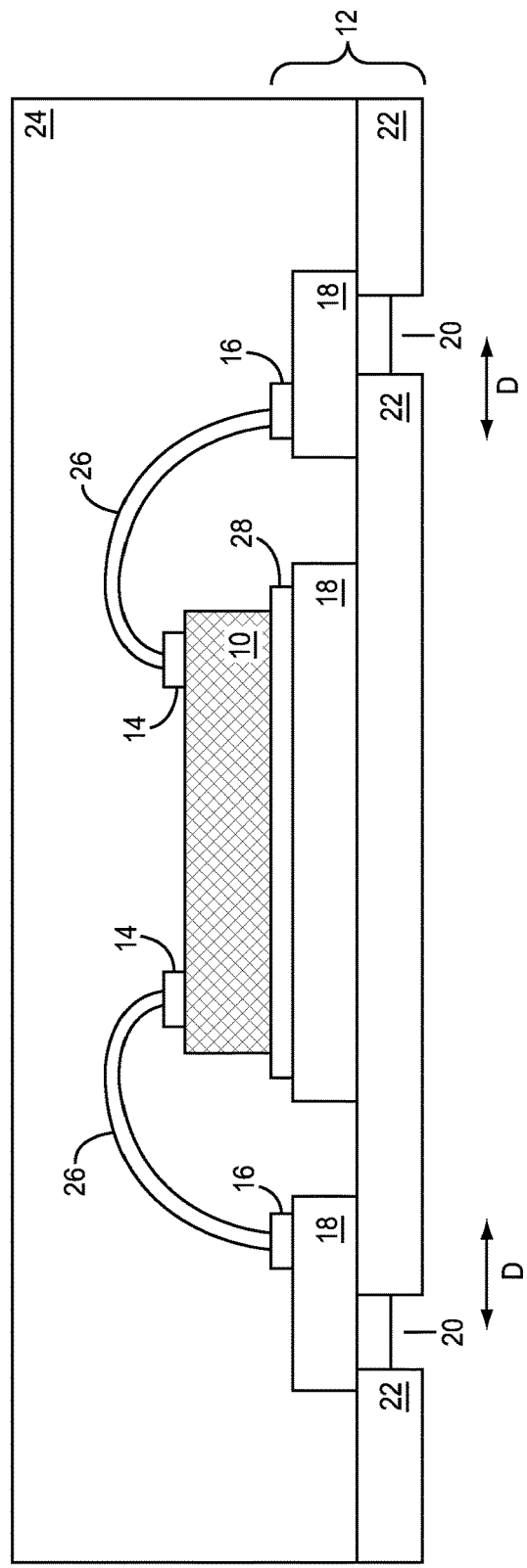
FIG. 2 is a schematic representation of an IC package with an attached redistribution layer according to an additional embodiment.

FIG. 2 shows the IC package 10 with the attached redistribution layer 12 according to one embodiment of the present disclosure. According to this embodiment, the IC package 10 is a wire-bonded die. The connection points 14 of the IC package 10 are connected to the redistribution layer 12 at the package connection pads 16 by one or more bond wires 26. A die attach material 28 may also be provided in order to secure the wire-bonded die to the redistribution layer 12. The package connection pads 16 are wire bonded to one or more redistribution paths 18, which are in turn plated to the one or more redistributed connection pads 20. The redistribution paths 18 are covered by the patterned soldering mask 22. The IC package and the redistribution layer 12 are stabilized by the over molding layer 24. As shown in FIG. 2, the redistributed connection pads 20 of the redistribution layer 12 relocate the connection points 14 of the IC package 10 by a predetermined distance D. Accordingly, the connection points 14 of the IC package 10 are redistributed to facilitate integration of the IC package 10 into a system.

Figure 3:
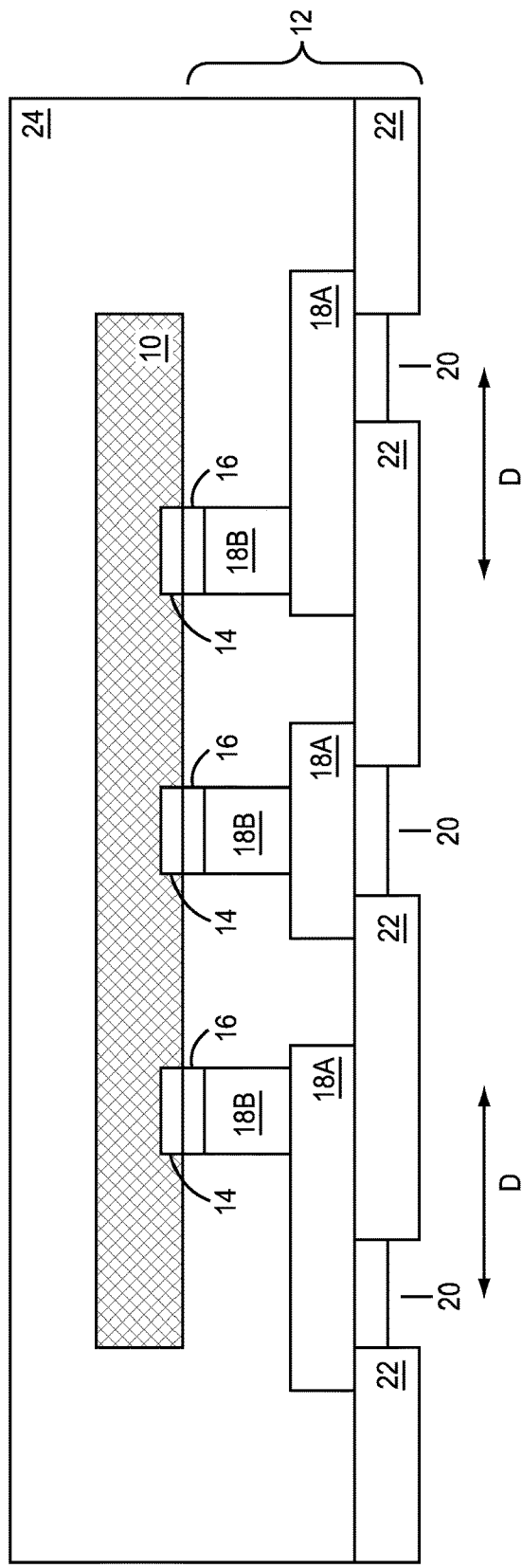
FIG. 3 is a schematic representation of an IC package with an attached redistribution layer according to an additional embodiment.

FIG. 3 shows the IC package 10 with the attached redistribution layer 12 according to an additional embodiment of the present disclosure. According to this embodiment, the IC package 10 is a non-bumped die without extruding connection points. The connection points 14 of the IC package 10 are directly connected to the redistribution layer 12 by the package connection pads 16, for example, by a soldering process. The package connection pads 16 are plated to one or more redistribution paths 18. In this embodiment, the redistribution layer has two layers of redistribution paths 18 in order to properly connect to the IC package 10. A top layer of redistribution paths 18B is adapted to align with the connection points 14 of the IC package 10, and is plated to a bottom layer of redistribution paths 18A. The bottom layer of redistribution paths 18A is plated to the one or more redistributed connection pads 20. The bottom layer of redistribution paths 18A is covered by the patterned soldering mask 22. The IC package 10 and the redistribution layer 12 are stabilized by the over molding layer 24. As shown in FIG. 3, the redistributed connection pads 20 of the redistribution layer 12 relocate the connection points 14 of the IC package 10 by a predetermined distance D. Accordingly, the connection points 14 of the IC package 10 are redistributed to facilitate integration of the IC package 10 into a system.

Figure 4A:
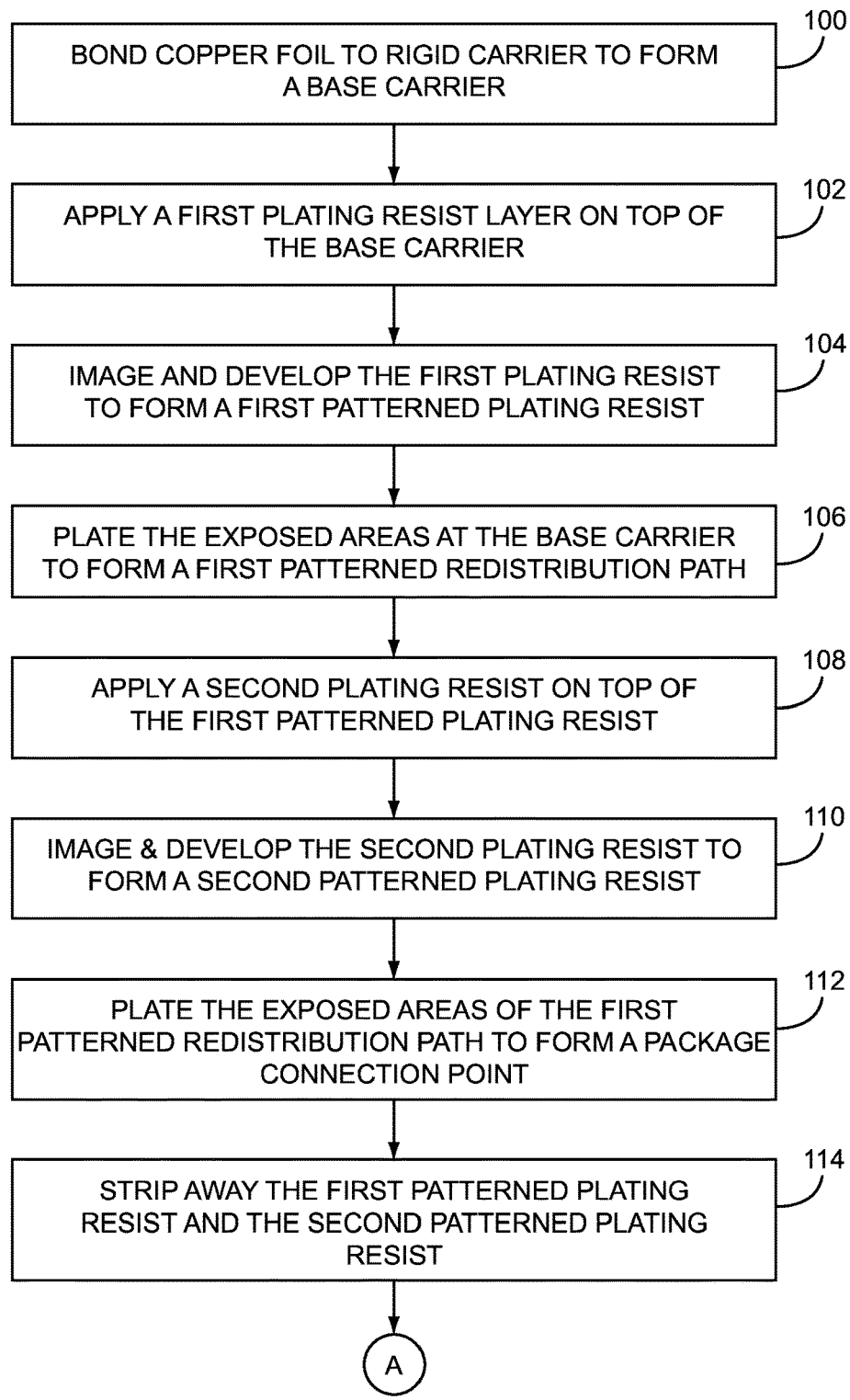
FIGS. 4A and 4B are diagrams representing the process for creating a redistribution layer.
Figure 4B:
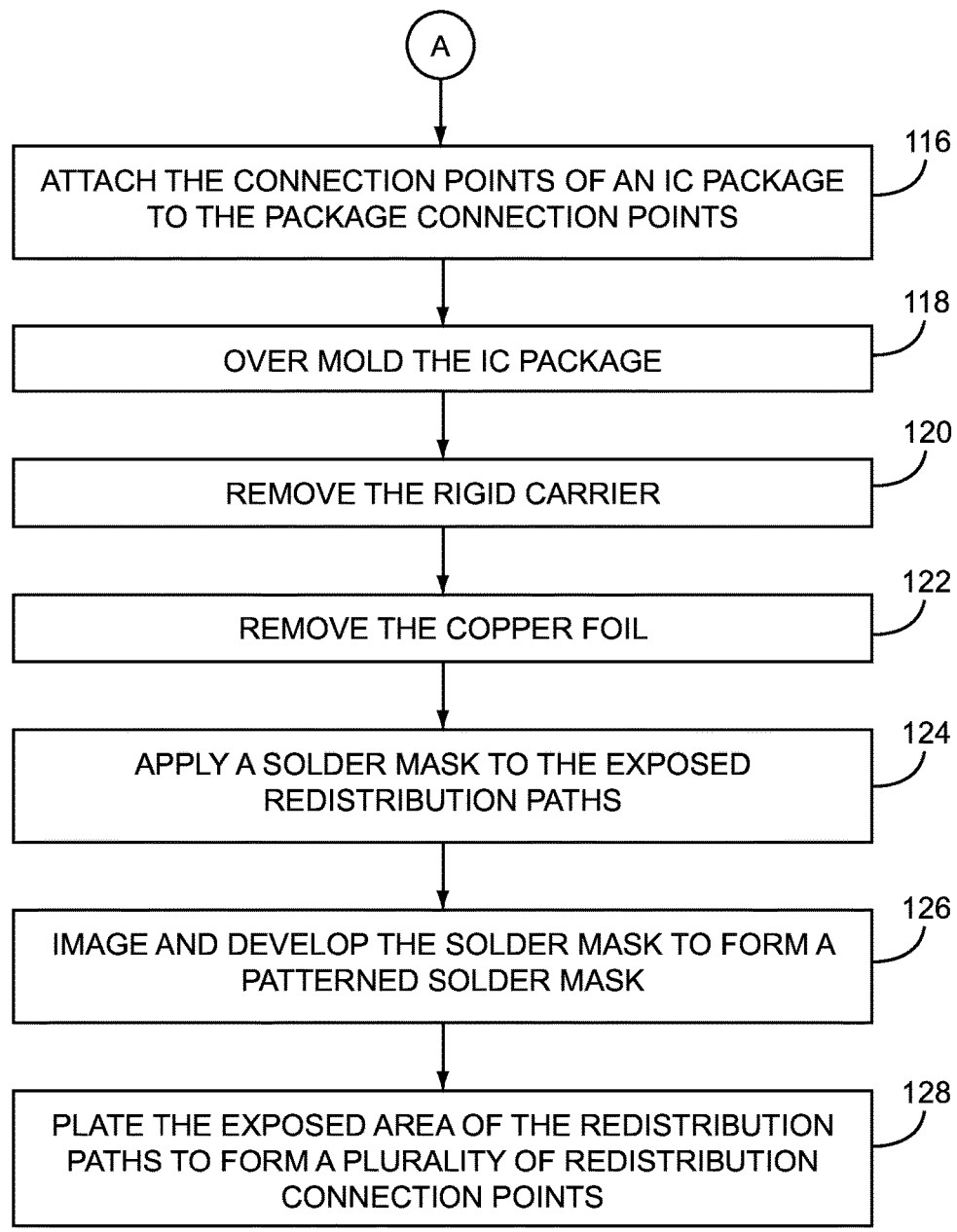

With reference to the flow diagram of FIG. 4 and the corresponding graphical representations of FIG. 5, a manufacturing process for the redistribution layer 12 is provided according to one embodiment of the present disclosure. The process begins by bonding a copper foil 30 to a rigid carrier 32 to form a base carrier 34 (step 100 and FIG. 5A). A first plating resist 36 is then applied to the copper foil 30 (step 102 and FIG. 5B). The first plating resist 36 is imaged, then developed to form a first patterned plating resist 38 (step 104 and FIG. 5C). The areas of the copper foil 30 exposed through the first patterned plating resist 38 are then plated to form one or more redistribution paths 18 (step 106 and FIG. 5D). This step may be repeated one or more times to form multiple layers of redistribution paths 18. A second plating resist 40 is then applied on top of the first patterned plating resist 38 (step 108 and FIG. 5F), and is imaged and developed to form a second patterned plating resist 42 (step 110 and FIG. 5G). The areas of the redistribution paths 18 exposed through the second patterned plating resist 42 are then plated to form the one or more package connection pads 16 (step 112 and FIG. 5H). The first patterned plating resist 38 and the second patterned plating resist 42 are then removed, using, for example, a chemical etching/stripping process (step 114 and FIG. 5I).

Figure 5A:
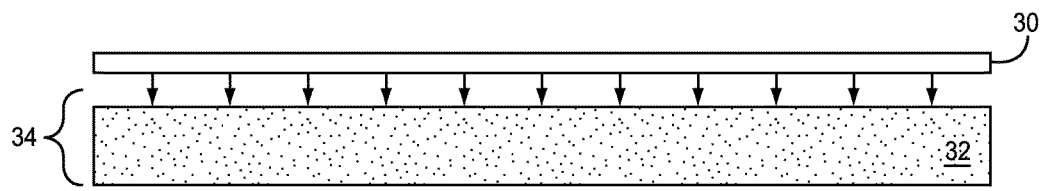
FIGS. 5A-5O are a graphic representation of each step of the process described in FIG. 4 for creating the redistribution layer.
Figure 5B:
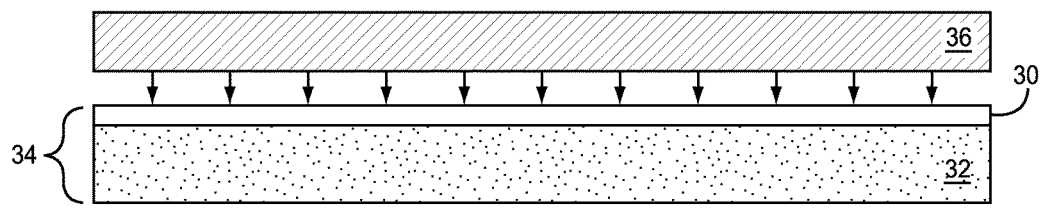
Figure 5C:
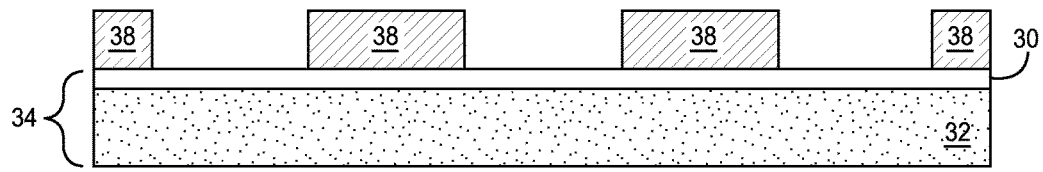
Figure 5D:
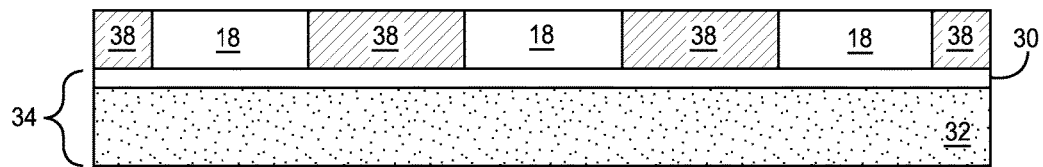
Figure 5E:
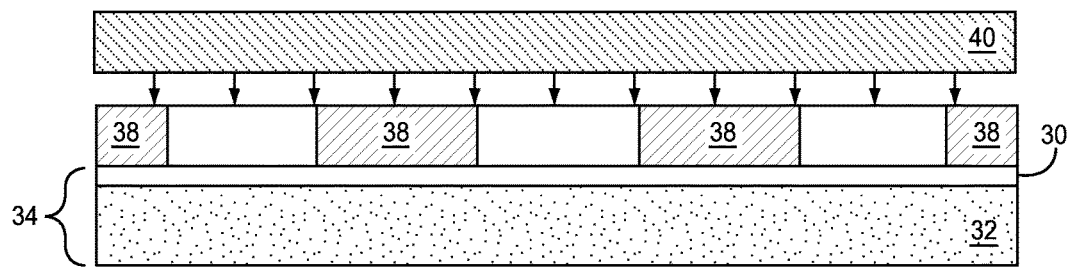
Figure 5F:
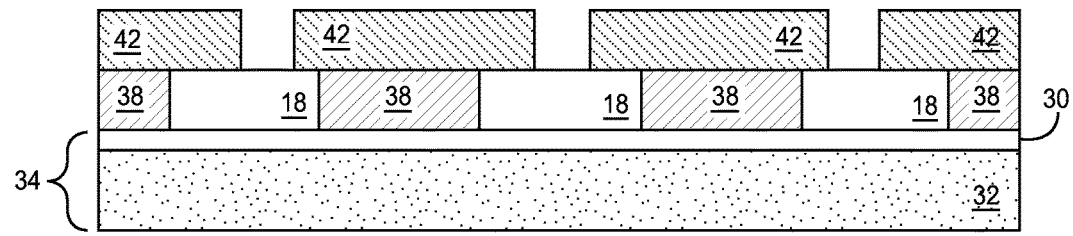
Figure 5G:
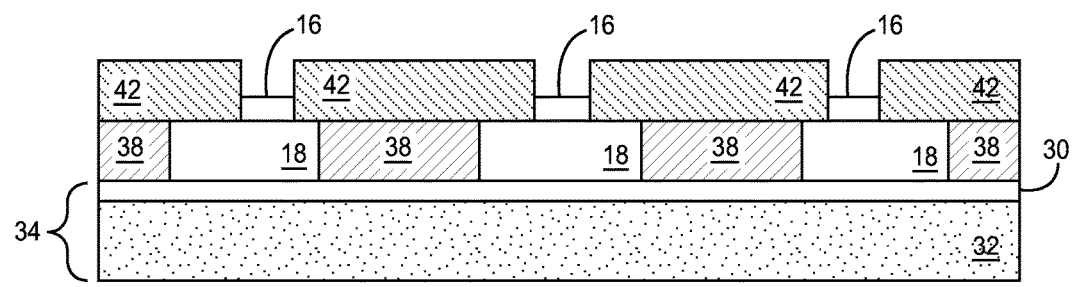
Figure 5H:
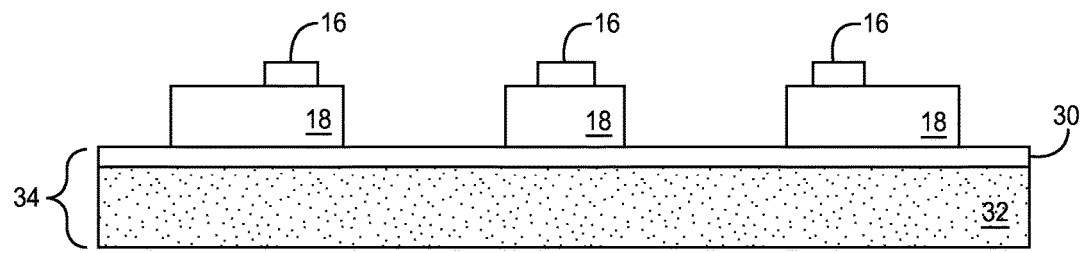
Figure 5I:
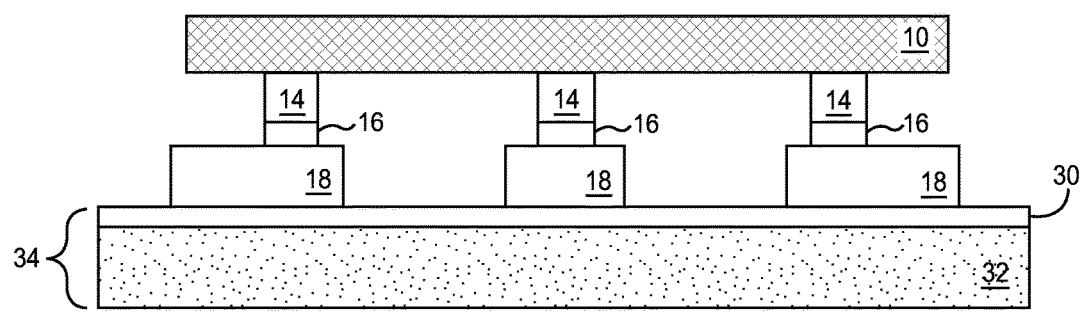
Figure 5J:
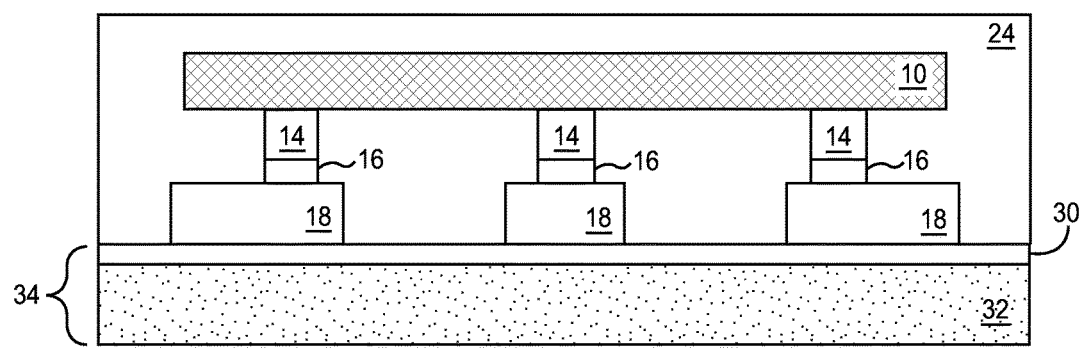
Figure 5K:
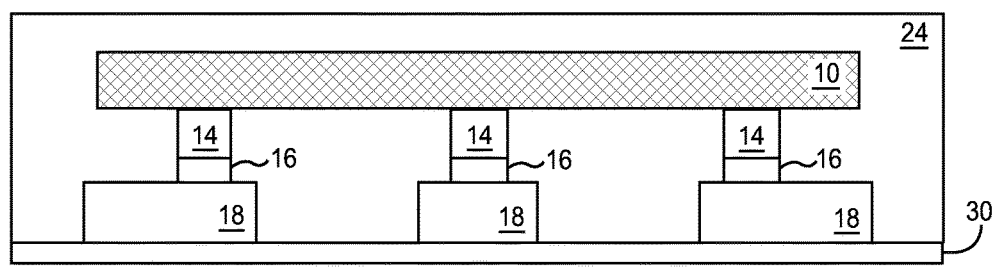
Figure 5L:
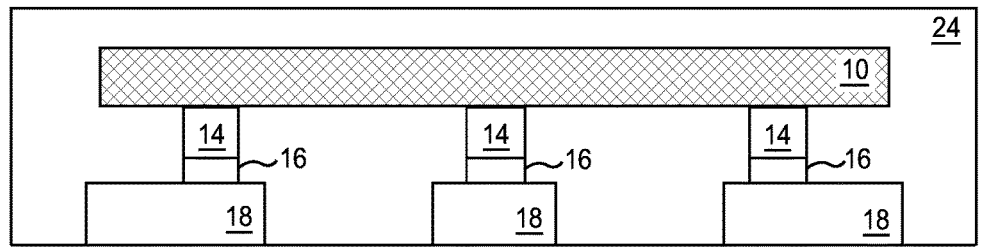
Figure 5M:
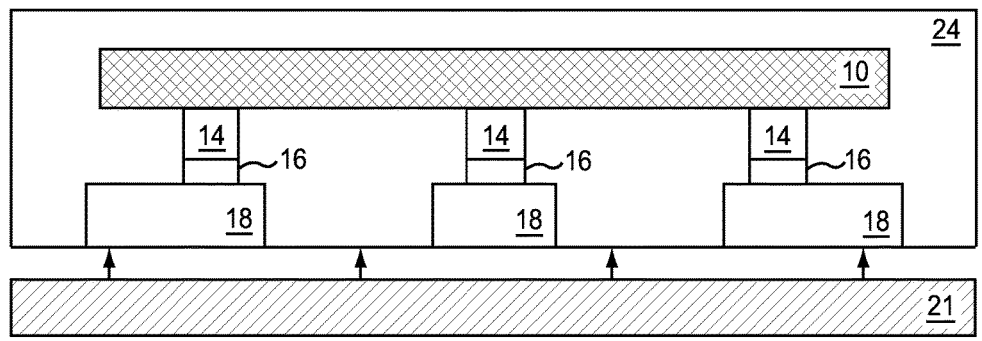
Figure 5N:
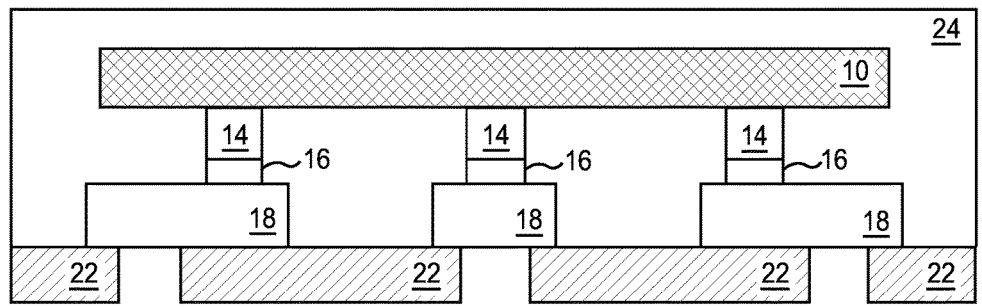
Figure 5O:
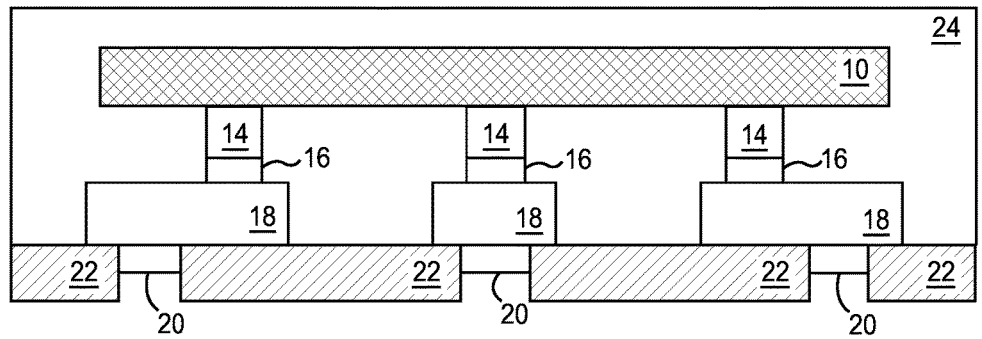

The connection points 14 of the IC package 10 are then connected to the package connection pads 16 (step 116 and FIG. 5J), and the IC package 10 is over molded with the over molding layer 24 for stability (step 118 and FIG. 5K). The base carrier 34 is then removed by first removing the rigid carrier 32 (step 120 and FIG. 5L), then removing the copper foil 30 with a chemical etch process (step 122 and FIG. 5M). The rigid carrier 32 may be removed, for example, by a mechanical routing process. A soldering mask 21 is applied to the exposed surface from which the base carrier 34 was removed (step 124 and FIG. 5N), and is imaged and developed to form a patterned soldering mask 22 (step 126 and FIG. 5O). The areas of the redistribution paths 18 exposed through the patterned soldering mask 22 are then plated to form the one or more redistributed connection pads 20 (step 128 and FIG. 5P).

The composition, structure, and type of components used to generate the redistribution layer 12 can vary in the manufacturing process. In one embodiment, the copper foil 30 may be approximately 3-5 microns thick. The rigid carrier 32 may comprise a laminate material or any other rigid material suitable for supporting the copper foil 30 throughout the manufacturing process. The redistribution paths 18 may be made of electrodeposited copper approximately 10-30 microns thick. The one or more package connection pads 16 may be made of electrodeposited tin approximately 5-20 microns thick, deposited electroless nickel and immersion gold, with respective approximate thicknesses of 0.4-6.0 microns and 0.05-0.15 microns, immersion silver approximately 0.12-0.20 microns thick, electrodeposited nickel and gold, with respective approximate thicknesses of 3.0-6.0 microns and 0.05-0.15 microns, or an organic solderability preservative.

The one or more redistributed connection pads 20 may be made of electrodeposited tin approximately 5-20 microns thick, deposited electroless nickel and immersion gold, with respective approximate thicknesses of 0.4-6.0 microns and 0.05-0.15 microns, immersion silver approximately 0.12-0.20 microns thick, electrodeposited nickel and gold, with respective approximate thicknesses of 3.0-6.0 microns and 0.05-0.15 microns, or an organic solderability preservative.

Figure 6A:
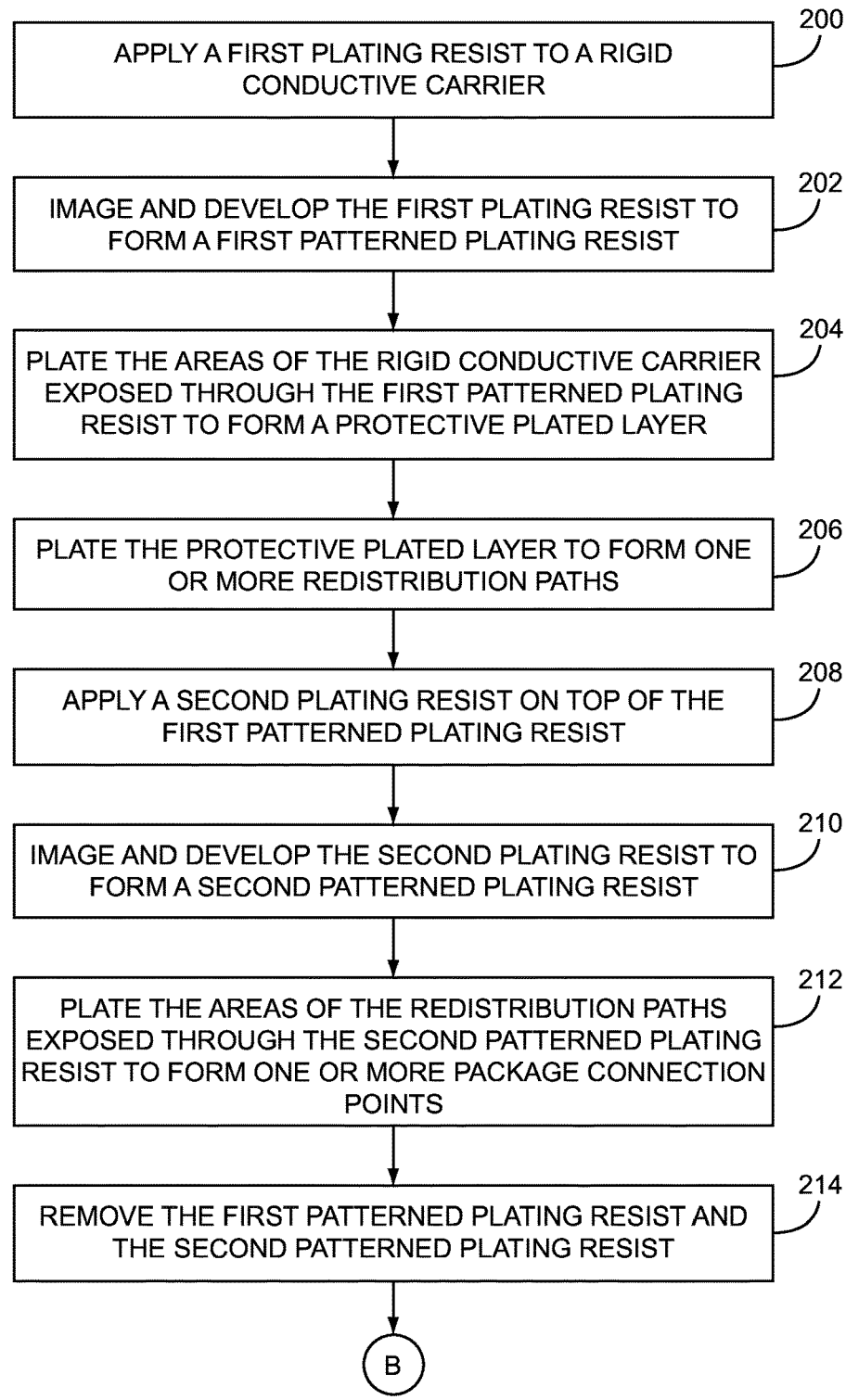
FIGS. 6A and 6B are diagrams representing the process for creating a redistribution layer according to an additional embodiment of the present disclosure.
Figure 6B:
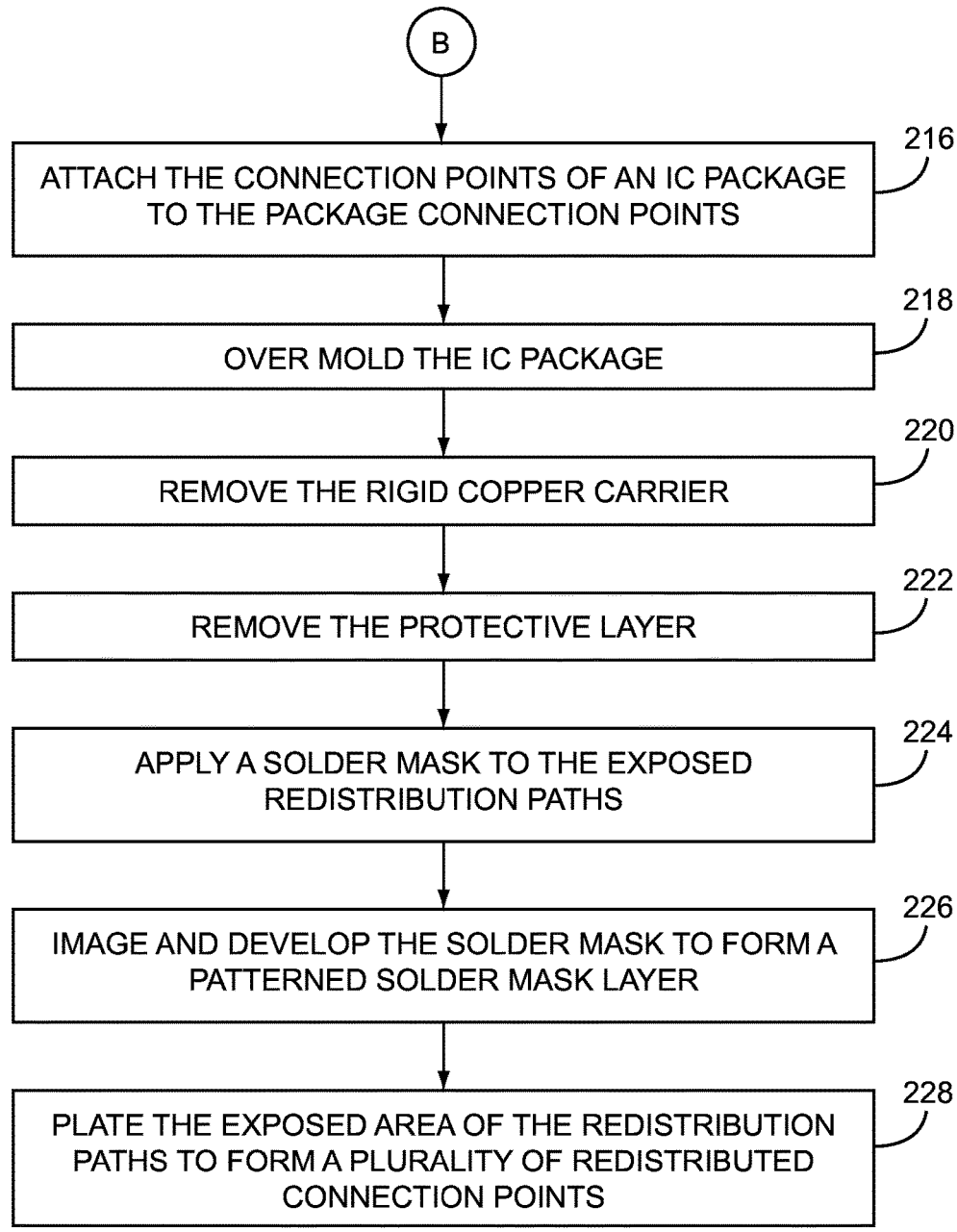

With reference to the flow diagram of FIG. 6 and the corresponding graphical representations of FIG. 7, a manufacturing process for the redistribution layer 12 is provided according to one embodiment of the present disclosure. The process begins by application of a first plating resist 45 to a plate-able copper carrier layer 44 (step 200 and FIG. 7A). The first plating resist 45 is then imaged and developed to form a first patterned plating resist 46 (step 202 and FIG. 7B). The areas of the plate-able copper carrier layer 44 exposed through the first patterned plating resist 46 are then plated to form a first protective layer 48 (step 204 and FIG. 7C). The first protective layer 48 is then plated to form one or more redistribution paths 18 (step 206 and FIG. 7D). This step may be repeated one or more times to form multiple layers of redistribution paths 18. A second plating resist 50 is then applied on top of the first patterned plating resist 46 (step 208 and FIG. 7F), and imaged and developed to form a second patterned plating resist 52 (step 210 and FIG. 7G). The areas of the redistribution paths 18 exposed through the second patterned plating resist 52 are then plated to form the one or more package connection pads 16 (step 212 and FIG. 7H). The first patterned plating resist 46 and the second patterned plating resist 52 are then removed, using, for example, a chemical etching/stripping process (step 214 and FIG. 7I).

Figure 7A:
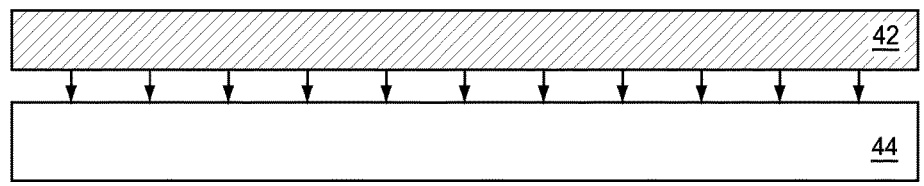
FIGS. 7A-7O are a graphic representation of each step of the process described in FIG. 6 for creating the redistribution layer.
Figure 7B:
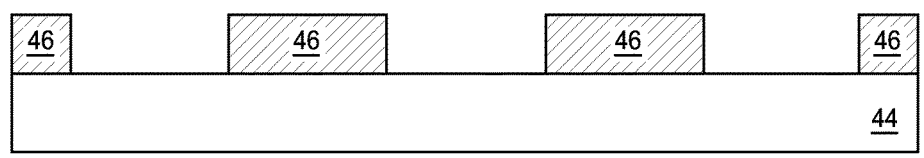
Figure 7C:
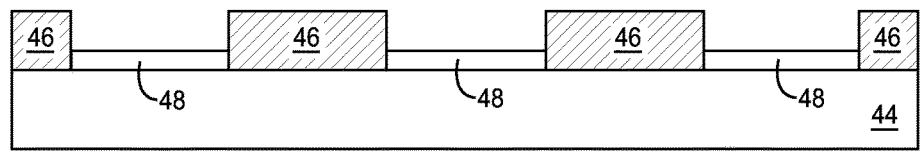
Figure 7D:
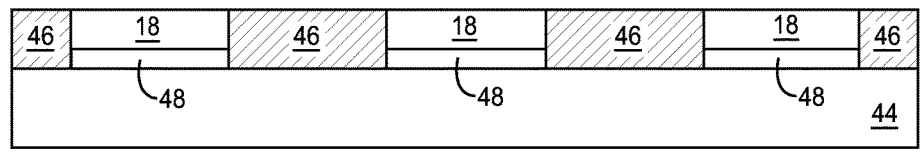
Figure 7E:
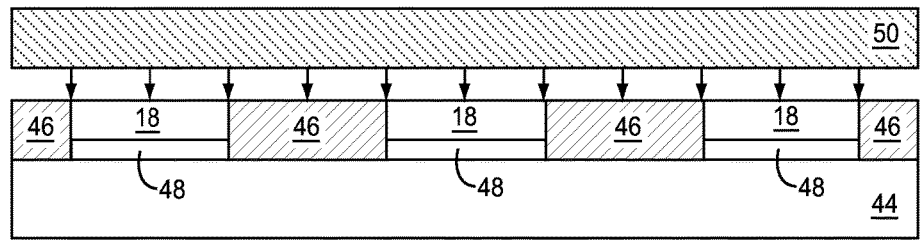
Figure 7F:
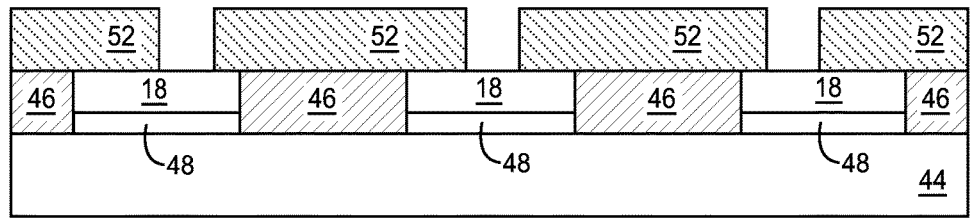
Figure 7G:
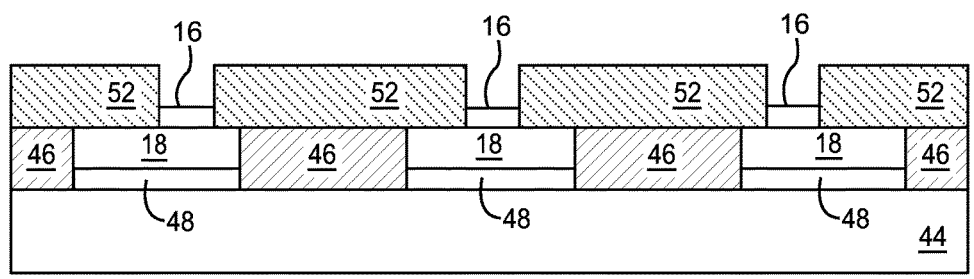
Figure 7H:
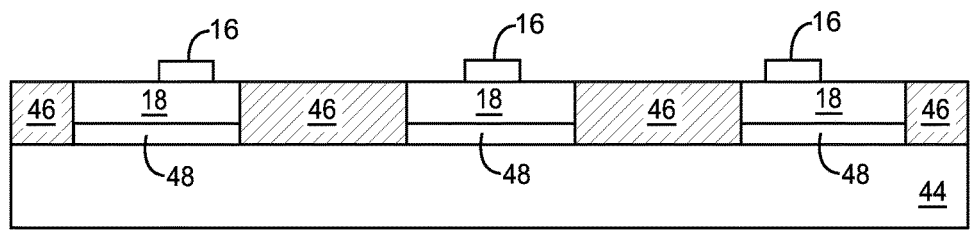
Figure 7I:
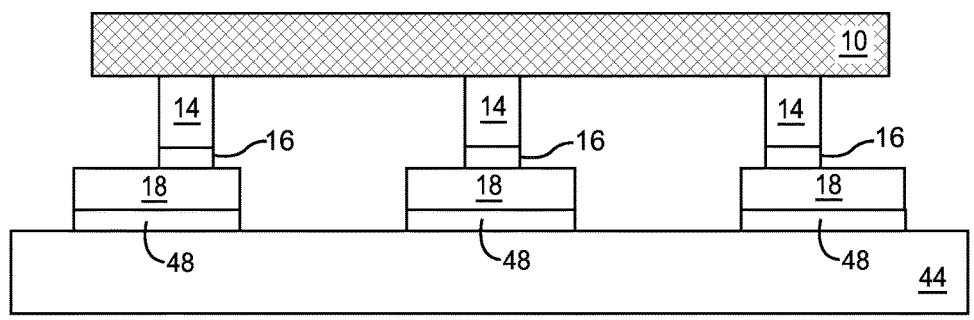
Figure 7J:
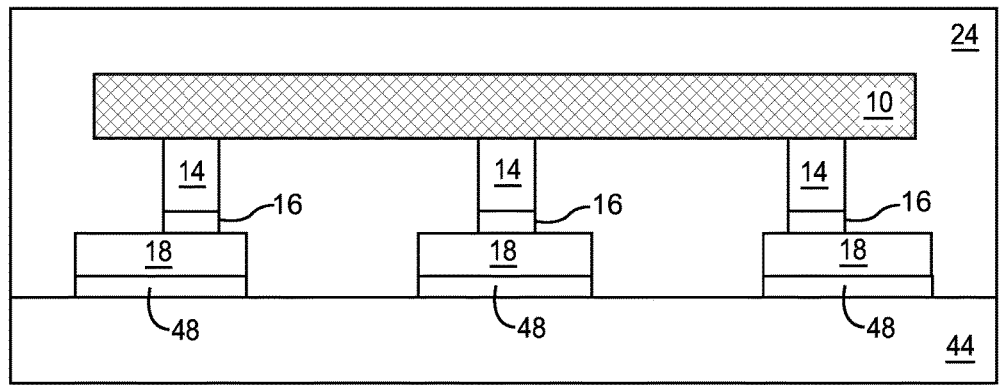
Figure 7K:
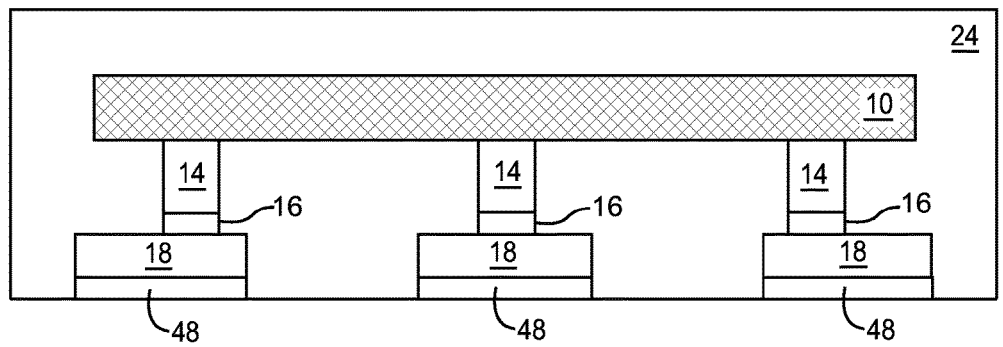
Figure 7L:
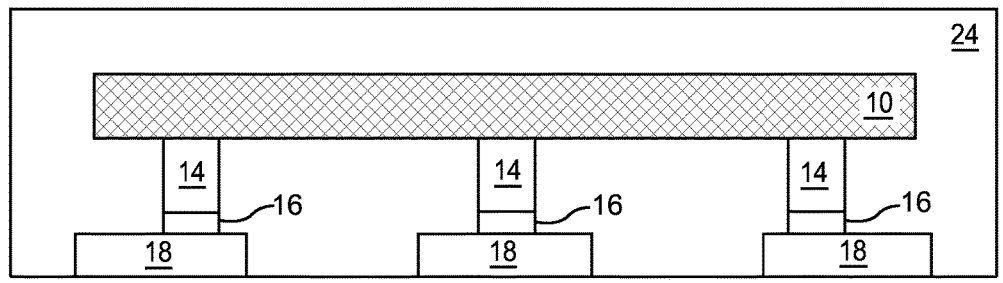
Figure 7M:
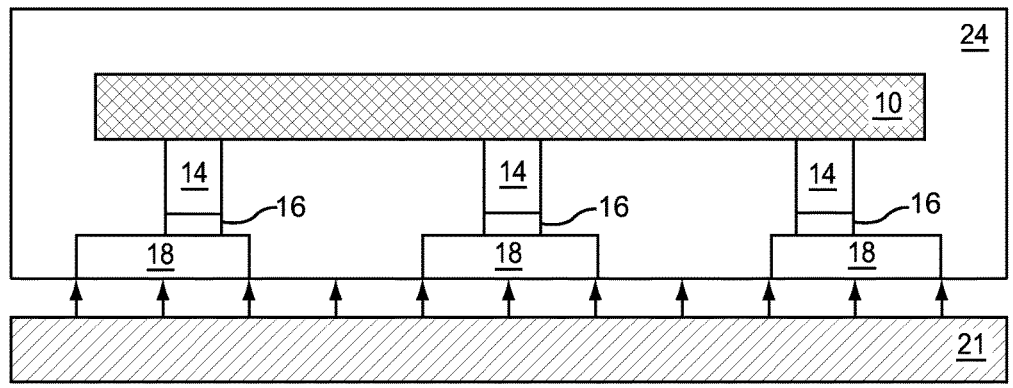
Figure 7N:
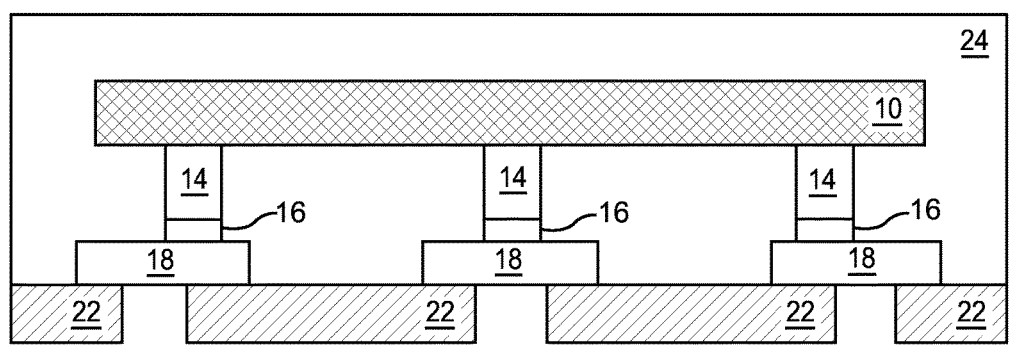
Figure 7O:
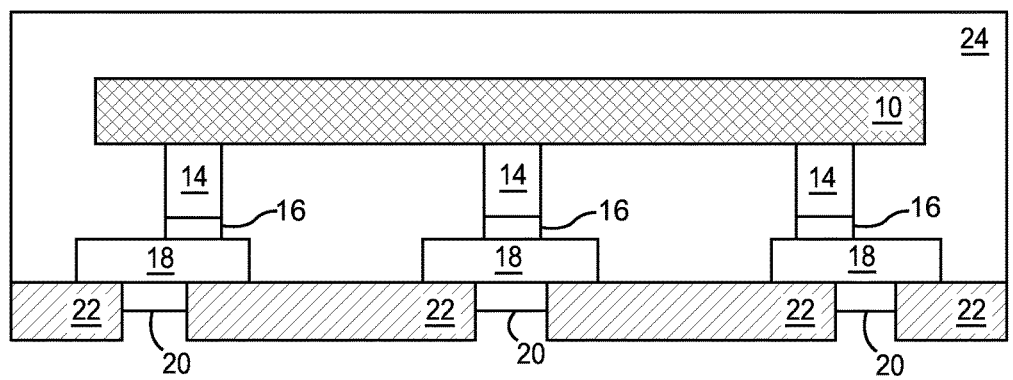

The connection points 14 of the IC package 10 are then connected to the package connection pads 16 (step 216 and FIG. 7J), and the IC package is stabilized with the over molding layer 24 (step 218 and FIG. 7K). The plate-able copper carrier layer 44 is then removed using, for example, a chemical etching process (step 220 and FIG. 7L). The first protective layer 48 is also removed, using, for example, a chemical etching process (step 222 and FIG. 7M). A soldering mask 21 is applied to the exposed surface from which the plate-able copper carrier layer 44 and the first protective layer 48 were removed (step 224 and FIG. 7N). The soldering mask 21 is imaged and developed to form a patterned soldering mask 22 (step 226 and FIG. 7O). The exposed surface of the one or more redistribution paths 18 are then plated to form the one or more redistributed connection pads 20 (step 228 and FIG. 7P).

The composition, structure, and type of components used to generate the redistribution layer 12 can vary in the manufacturing process. The plate-able copper carrier layer 44 may comprise a rigid copper sheet approximately 100-150 microns in thickness. The protective layer may comprise nickel or tin approximately 3-5 microns in thickness, and may be adapted to be easily etched away. The redistribution paths 18 may be made of electrodeposited copper approximately 10-30 microns thick.

The one or more package connection pads 16 may be made of electrodeposited tin approximately 5-20 microns thick, deposited electroless nickel and immersion gold, with respective approximate thicknesses of 0.4-6.0 microns and 0.05-0.15 microns, immersion silver approximately 0.12-0.20 microns thick, electrodeposited nickel and gold, with respective approximate thicknesses of 3.0-6.0 microns and 0.05-0.15 microns, or an organic solderability preservative.

The one or more redistributed connection pads 20 may be made of electrodeposited tin approximately 5-20 microns thick, deposited electroless nickel and immersion gold, with respective approximate thicknesses of 0.4-6.0 microns and 0.05-0.15 microns, immersion silver approximately 0.12-0.20 microns thick, electrodeposited nickel and gold, with respective approximate thicknesses of 3.0-6.0 microns and 0.05-0.15 microns, or an organic solderability preservative.

Those skilled in the art will recognize improvements and modifications to the preferred embodiments of the present disclosure. All such improvements and modifications are considered within the scope of the concepts disclosed herein and the claims that follow.

What is claimed is:
1. A method comprising:
providing a first patterned plating resist to a first plate-able layer;
plating areas of the first plate-able layer exposed through the first patterned plating resist to form one or more redistribution paths in between the first patterned plating resist;
providing a second patterned plating resist on top of the first patterned plating resist and over a portion of the one or more redistribution paths;
plating areas of the one or more redistribution paths exposed through the second patterned plating resist to form one or more package connection pads in between the second patterned plating resist;
connecting an IC package to the one or more package connection pads, wherein the first patterned plating resist and the second patterned plating resist are not coupled to the IC package;
over-molding the IC package;
removing the first plate-able layer;
providing a patterned soldering mask to an exposed surface from which the first plate-able layer was removed, wherein the patterned soldering mask is under the one or more redistribution paths; and
plating areas of the one or more redistribution paths exposed through the patterned soldering mask to form one or more redistributed connection pads.

2. The method of claim 1 wherein providing the first patterned plating resist to the first plate-able layer comprises:

applying a first plating resist to the first plate-able layer; and imaging and developing the first plating resist to form the first patterned plating resist.

3. The method of claim 2 further comprising:

removing the first patterned plating resist and the second patterned plating resist.

4. The method of claim 1 wherein providing the second patterned plating resist on top of the first patterned plating resist comprises:

applying a second plating resist on top of the first patterned plating resist; and imaging and developing the second plating resist to form the second patterned plating resist.

5. The method of claim 4 further comprising:

removing the first patterned plating resist and the second patterned plating resist.

6. The method of claim 1 further comprising:

removing the first patterned plating resist and the second patterned plating resist.

7. The method of claim 1 wherein providing the patterned soldering mask to the exposed surface from which the first plate-able layer was removed comprises:

applying a soldering mask to the exposed surface from which the first plate-able layer was removed; and imaging and developing the soldering mask to form the patterned soldering mask.

8. The method of claim 1 wherein the first plate-able layer comprises a copper foil bonded to a rigid carrier.

9. The method of claim 8 wherein the copper foil is between about 3-5 microns thick.

10. The method of claim 1 wherein the first plate-able layer comprises a copper sheet between about 100-150 microns thick.

11. The method of claim 1 wherein the one or more redistribution paths comprise electrodeposited copper between about 10-30 microns thick.

12. The method of claim 1 wherein the one or more package connection pads comprise electroless nickel between about 0.4-6.0 microns thick and immersion gold between about 0.05-0.15 microns thick.

13. The method of claim 1 wherein the one or more package connection pads comprise electrodeposited tin between about 5-20 microns thick.

14. The method of claim 1 wherein the one or more package connection pads comprise immersion silver between about 0.12-0.20 microns thick.

15. The method of claim 1 wherein the one or more package connection pads comprise electrodeposited nickel between about 3.0-6.0 microns thick and electrodeposited gold between about 0.05-0.15 microns thick.

16. The method of claim 1 wherein the one or more package connection pads comprise an organic solderability preserve.

17. The method of claim 1 wherein the one or more redistributed connection pads comprise electroless nickel between about 0.4-6.0 microns thick and immersion gold between about 0.05-0.15 microns thick.

18. The method of claim 1 wherein the one or more redistributed connection pads comprise electrodeposited tin between about 5-20 microns thick.

19. The method of claim 1 wherein the one or more redistributed connection pads comprise immersion silver between about 0.12-0.20 microns thick.

20. The method of claim 1 wherein the one or more redistributed connection pads comprise electrodeposited nickel between about 3.0-6.0 microns thick and electrodeposited gold between about 0.05-0.15 microns thick.

21. The method of claim 1 wherein the one or more redistributed connection pads comprise an organic solderability preserve.

22. The method of claim 1 wherein the one or more package connection pads are confined within the corresponding one or more redistribution paths, respectively.

* * * * *